United States Patent
Hedberg

(12) 
(10) Patent No.: US 6,175,250 B1
(45) Date of Patent: Jan. 16, 2001

(54) OUTPUT BUFFER CIRCUIT FOR DRIVING A TRANSMISSION LINE

(75) Inventor: Mats Hedberg, Haninge (SE)

(73) Assignee: Telefonaktiebolaget L M Ericsson (publ), Stockholm (SE)

(*) Notice: Under 35 U.S.C. 154(b), the term of this patent shall be extended for 0 days.

(21) Appl. No.: 09/269,369

(22) PCT Filed: Sep. 23, 1997

(86) PCT No.: PCT/EP97/05219

§ 371 Date: Jul. 2, 1999

§ 102(e) Date: Jul. 2, 1999

(87) PCT Pub. No.: WO98/13766

PCT Pub. Date: Apr. 2, 1998

(30) Foreign Application Priority Data

Sep. 24, 1996  (DE) .............................. 196 39 230

(51) Int. Cl.[7] .............................. H03K 19/0948
(52) U.S. Cl. ........................ 326/83; 365/185.03
(58) Field of Search .................. 307/443, 446; 326/27, 30, 83; 365/185.03

(56) References Cited

U.S. PATENT DOCUMENTS

| | | | |
|---|---|---|---|
| 4,719,369 | 1/1988 | Asano et al. ............ | 307/443 |
| 4,961,010 * | 10/1990 | Davis ................... | 307/443 |
| 5,134,311 | 7/1992 | Biber et al. . | |
| 5,184,033 * | 2/1993 | Chiao et al. ............ | 307/446 |
| 5,285,116 * | 2/1994 | Thaik ................... | 307/443 |
| 5,404,057 | 4/1995 | Hasegawa ............... | 326/63 |
| 5,497,106 * | 3/1996 | Raatz et al. ............ | 326/30 |
| 5,559,447 * | 9/1996 | Rees ................... | 326/30 |
| 5,917,335 * | 6/1999 | Rees ................... | 326/27 |
| 5,963,047 * | 10/1999 | Kwong et al. ........... | 326/27 |

FOREIGN PATENT DOCUMENTS 0 410 402 A2   1/1991   (EP) .

OTHER PUBLICATIONS

André DeHon, et al.; *Automatic Impedance Control*, 1993 IEEE International Solid–State Circuits Conference; Article TP 10.7, pp. 164–165.

* cited by examiner

Primary Examiner—David Nelms
Assistant Examiner—Thong Le
(74) Attorney, Agent, or Firm—Jenkens & Gilchrist, P.C.

(57) ABSTRACT

An output buffer circuit for driving a transmission line comprises a switch stage including switches for connecting the output of the switch stage with the input of the switch stage in accordance with digital data. First impedance means adjustable in accordance with a control signal are connected to the switch stage. Moreover, monitor impedance means are provided, an impedance of which is adjustable in accordance with a monitor impedance control signal. The first impedance means is connected to receive at its impedance control input a control signal derived from a control signal applied to monitor impedance means. The monitor impedance means constitutes a replica of the first impedance means and allows monitoring and controlling of the first impedance means, such that the output impedance of the switch stage may be adjusted or controlled.

26 Claims, 6 Drawing Sheets

OUTPUT BUFFER CIRCUIT FOR DRIVING A TRANSMISSION LINE

The present invention relates to an output buffer circuit for driving a transmission line, the output impedance of the output buffer circuit being adjustable to match the characteristic impedance of a transmission line connected to the output buffer.

With the ever increasing operating speed of digital circuitry, also the demands on interfaces linking different circuit components regarding data transmission capacity will increase. The higher the bit rate to be transmitted via a transmission line, the more important is that both the transmitting side and the receiving side connected via the transmission line, have a source impedance and an input impedance, respectively, which match the characteristic impedance of the transmission line. Such impedance matching is inevitable for avoiding reflections on the transmission line which might otherwise disturb data transmission at high data rates.

U.S. Pat. No. 5,134,311 discloses a self-adjusting impedance matching driver circuit having an array of pull-up gates to VDD and an array of pull-down gates to ground. One or more of such gates is selectively enabled in response to circuit means that monitors the impedance match between the output of the driver circuit and the network it drives. For this purpose a comparator has an input connected to the output of the driver circuit and an output that controls latches for selectively enabling one or more of said pull-up gates and other latches for controlling one or more of said pull-down gates, such that closed loop output impedance control is performed.

IEEE International Solid State Circuits Conference 1993, Session 10, High Speed Communication and Interfaces, paper 10.7 discloses a circuit for performing automatic impedance matching between a CMOS output buffer circuit and an externally connected transmission line. According to that proposal, impulses are output by the driver circuit to the transmission line, and during a period of time prior to the arrival of possible reflections from the end of the transmission line, the output voltage of the buffer is controlled to half the supply voltage, implying that then the output impedance of the buffer equals the characteristic impedance of the line. Such control is performed independently for the pull-up gate of the CMOS driver and the pull-down gate of the CMOS driver, each of these gates comprising an array of drive transistors selectively enabled by an impedance control register.

Both these approaches of the prior art adopt some kind of control loop for adjusting the output impedance of a line driver circuit, the control loop including the detection of the actual output impedance and the adjustment of impedance means determining the actual output impedance of the driver, such that the detected-output impedance matches a desired value.

However, detecting the actual output impedance of the buffer is not easily possible on a continuous basis, without interfering with the data transmission that takes place. For this reason, the first mentioned approach suggests setting up the output buffer at power up and thereafter only if the driven network is changed substantially. The second approach suffers from extreme timing demands due to the fact that output impedance detection has to take place before a possible reflection from the end of the transmission line has arrived at its beginning.

It is the object of the present invention, to provide an output buffer circuit having an output impedance which can be adjusted to a desired impedance value with a simple circuit that allows control of the output impedance while data transmission takes place and without strict requirements on the precision of the components or on timing and speed of the impedance adjustment circuit.

According to the present invention this object is solved as defined in the independent claim. Advantageous embodiments are described in the dependent claims.

According to the present invention, the output impedance of an output buffer circuit is controlled by means of controlling the impedance of a monitor impedance means having electrical characteristics similar to the electrical characteristics of the buffer circuit components determining the output impedance of the buffer. An impedance control signal for adjusting the buffer output impedance is derived from a monitor control signal adjusting or controlling the impedance of the monitor impedance means.

In this context, "derived" has the meaning that the derived control signal is a predetermined function of the monitor control signal. In the simplest and preferred case, the derived control signal is identical with the monitor control signal. Depending on design parameters of the monitor component in relation to corresponding design parameters of the components determining the actual output impedance of the buffer circuit, other functional relations may be appropriate, e.g. a proportionality between the monitor control signal and the output impedance control signal.

The components determining the actual output impedance and the monitor impedance means are designed such that they will behave similar, and such that external influences like temperature as well as process variations during their manufacture will have similar influence on both. This can be achieved e.g. by means of manufacturing both components on the same semiconductor chip and by the same process, as is well known as such. Preferably, the electrical circuit environment of the monitor components is designed to be similar to the electrical circuit environment of the components determining the output impedance of the buffer.

Accordingly, the adjustment of the monitor components to a desired impedance value will result in that the components determining the output impedance have a corresponding desired impedance value.

The monitor impedance means can be a component functionally and structurally separate from the components determining the actual output impedance and the components involved in the transmission of data signals.

According to a preferred embodiment of the present invention, an output buffer circuit and an input buffer circuit can be provided on the same chip and use the same impedance controlled monitor impedance means for deriving adjustment signals both for the output impedance means and for the input termination impedance means or for output impedance means and input impedance means, respectively, of a plurality of buffer circuits for a plurality of signal channels.

According to a preferred embodiment, an output stage of an output buffer circuit according to the present invention comprises a structure having a first functional layer for switching between an input port connected to a voltage source and an output port connected to the transmission line, in accordance with data to be transmitted, and a second functional layer for determining the source impedance of this voltage source.

The first functional layer may comprise a bridge circuit including four switches for driving a symmetrical transmission line or a pair of switches for driving an asymmetric transmission line.

The second layer preferably comprises controllable impedance means connected in series with the first layer and connected between power supply terminals supplying operating power to the buffer. The impedance means may be embodied as field effect transistors, preferably MOSFETS.

According to a preferred embodiment, the monitor impedance means are replicas of the MOSFETs included in the second functional layer for determining the output impedance.

The term "replica of an element" denotes in particular a copy of the element, the copy having substantially identical physical dimensions (like width, height, depth) and parameters (like impurity concentration, type, doping method etc.) manufactured with the same process, and consequently, having substantially identical electrical characteristics. In a more general sense this term also denotes elements not being identical in all dimensions and parameters but having electrical characteristics in a predetermined relationship with the element. This will be the case e.g. if the geometrical dimensions of the element and its replica are chosen different from each other.

Preferably, the monitor impedance means furthermore includes replicas of the switches contributing to the output impedance of the buffer circuit. The controllable component of the monitor impedance means is controlled such that its overall impedance takes a desired value and accordingly, also the output buffer circuit impedance including the switch impedance and the impedance of the second layer.

Each of the impedance means in said second functional layer can have its independent impedance adjustment means each including monitor impedance means controlled to take a desired impedance by means of a reference element, e.g. a resistor connected externally. If it is desired to adjust all impedances of the second functional layer with a single reference resistor to the same impedance value, a slave control loop can be provided that uses a replica of a monitor impedance controlled by a master control loop including said reference element, as internal reference impedance for controlling a further monitor impedance means to the desired impedance value.

According to another embodiment the second functional layer includes a pair of impedance means receiving the same impedance control voltage. Both impedance means comprise MOSFETs of the same conductivity type but having different channel geometries, i.e. channel with and/or length, such that for a given channel impedance the upper MOSFET requires a lower gate source voltage than the lower MOSFET. In this way a single control signal is sufficient for adjusting both the upper and the lower impedance means to approximately the same impedance.

In the following, preferred embodiments of the invention will be described with reference to the accompanying drawings which show:

Figure 1:
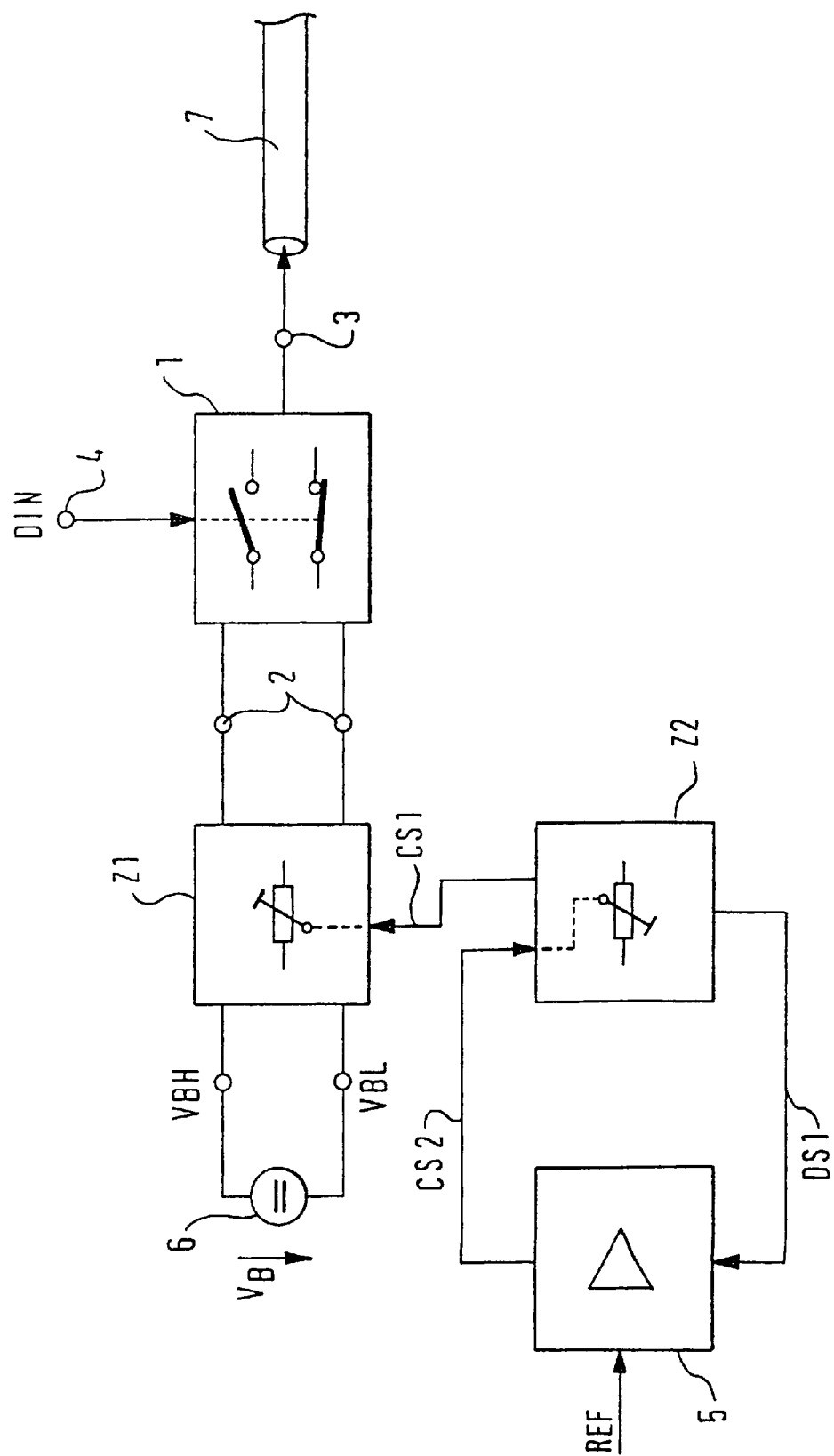
FIG. 1 shows a functional block diagram of an embodiment of the present invention.

FIG. 1 shows a functional block diagram of an embodiment of the present invention. In this figure, reference numeral 1 denotes a switch stage with an input port 2 and an output port 3. Power flows from input port 2 through the switch stage 1 and through output port 3 into a transmission line 7 connected to the output port 3. In the switch stage, switches are provided for connecting the input port 2 and the output port 3 in different manners according to a data signal DIN applied to signal port 4.

Z1 denotes impedance means connected between the input port 2 of the switch stage 1 and power supply terminals BH, BL of a power source 6 providing an operating voltage $V_B$. Impedance Z1 provides an impedance value that is adjustable in accordance with an impedance control signal CS1.

Reference numeral Z2 denotes a second impedance means an impedance of which is adjustable in accordance with a second impedance control signal CS2. Reference numeral 5 denotes a control amplifier outputting the second control signal CS2 depending on a reference signal REF and an impedance value detection signal DS1 indicating the actual impedance of the second impedance means Z2.

From this block diagram it is apparent that the output buffer comprises a first functional layer providing the switching of the output signal at port 3 and a second functional layer that enables adjusting the output impedance of output port 3. Moreover, second impedance means Z2 are provided an impedance of which can easily be monitored on the basis of the impedance detection signal DS1.

As is apparent from FIG. 1, the first impedance means Z1 receives a control signal that is derived from the control signal CS2 provided by the control amplifier 5 to the second impedance means Z2. If the second impedance means Z2 shows a dependency of electrical characteristics on the control signal CS2 which is similar to a dependency of corresponding electrical characteristics of impedance means Z1 on the first control signal CS1, it will be possible to adjust both the first impedance means Z1 and the second impedance means Z2 with control signal CS2, and to monitor the impedance values not only of the second impedance means Z2 but also of the first impedance means Z1 by means of the detection signal DS1.

Preferably, the second impedance means Z2 is a replica of the first impedance means Z1 with electrical characteristics substantially identical with the first impedance means Z1, and both the first and the second impedance means receive the same control signal CS2.

Control amplifier 5 outputs control signal CS2 such that the detected impedance value of the second impedance means Z2 follows the reference value REF.

Figure 2:
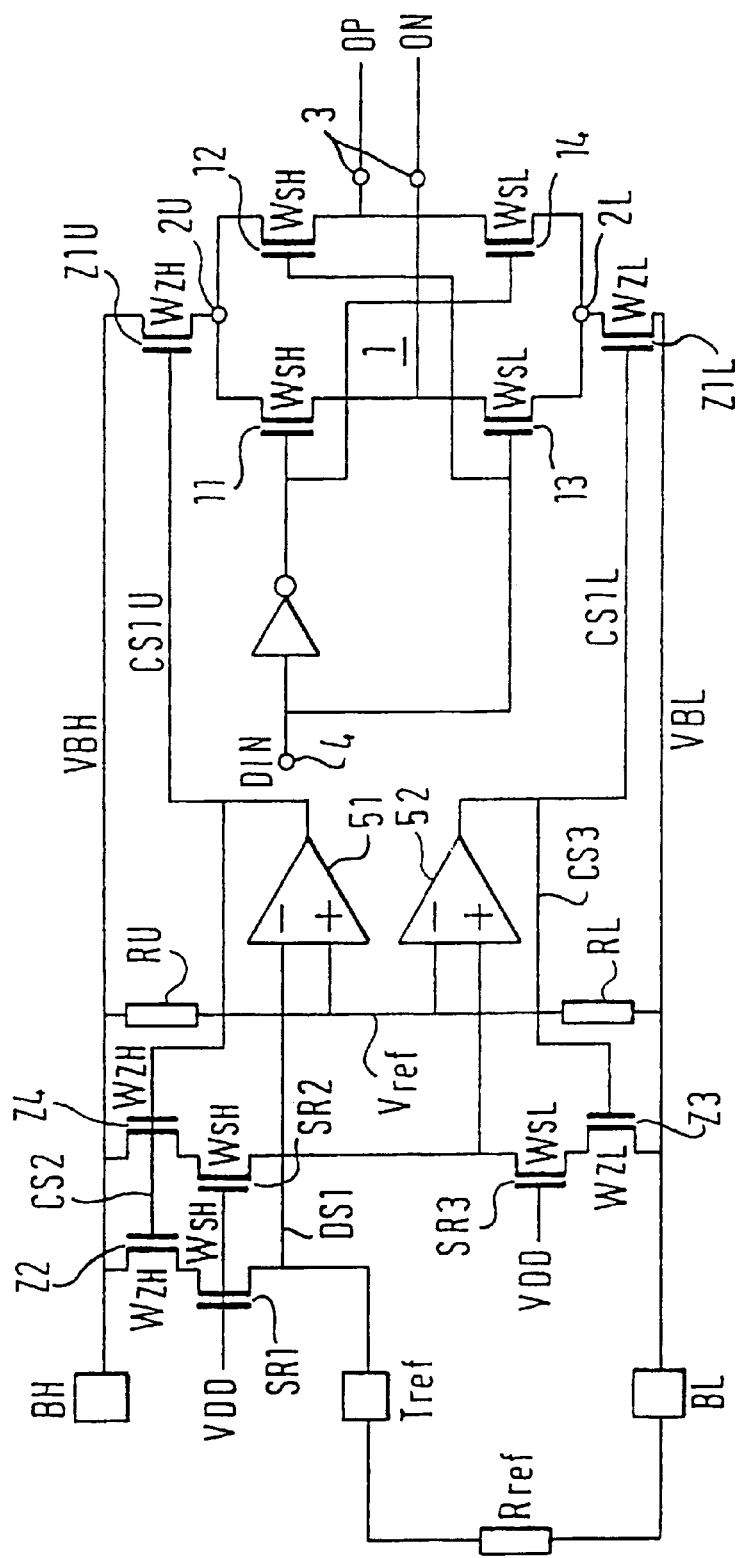
FIG. 2 shows an embodiment of an output buffer circuit having a master control loop and a slave control loop.

FIG. 2 shows an embodiment of an output buffer circuit having a master control loop and a slave control loop.

The output buffer circuit of this figure comprises a switch stage 1 including four switching transistors 11 to 14 connected as a bridge. This switching stage receives power via a first impedance means Z1 including an upper MOSFET Z1u connected between a supply line providing an upper supply potential VBH and upper supply node 2u of the bridge circuit, and furthermore including a lower MOSFET Z1l connected between a lower supply line VBL providing a lower supply potential and a lower supply node 2l of the bridge circuit 1.

The output of the bridge circuit is connected to a symmetrical transmission line having two wires OP and ON connected to output port 3 of the bridge. As is apparent from FIG. 2, the bridge circuit 1 provides for connection of upper and lower supply nodes 2u and 2l constituting the input port 2 of the bridge 1, with the output port 3 in accordance with input data DIN applied to a data input port 4. If DIN is at high potential, ON will be connected to node 2l while OP will be connected to node 2u whereas if DIN is at low potential ON will be connected to supply node 2u while OP will be connected to supply node 2l. In this way, the polarity of the output voltage at port 3 depends on the input data DIN.

The impedance of the upper MOSFET Z1u can be controlled by means of an impedance control signal CS1u applied to the gate of MOSFET Z1u. Similarly, the impedance of the lower MOSFET Z1l can be controlled by means of a control signal CS1l applied to the gate of MOSFET Z1l.

Z2 denotes a second impedance means constituted by a MOSFET which is a replica of MOSFET Z1u, connected to the same power supply line VBH as MOSFET Z1u. Both MOSFET Z1u and MOSFET Z2 have the same channel width $W_{ZH}$. In this and all other embodiments herein described, the transistors have the same channel length.

Reference numeral SR1 denotes a replica of the switch transistor 11 or 12. Transistor SR1 is connected in series with MOSFET Z2. The gate of MOSFET SR1 is connected to a potential VDD which is the same potential as that which is output to switching transistor 11 or 12 to switch it on.

The gate of MOSFET Z2 receives a control signal CS2 which is the same as the control signal CS1u received by MOSFET Z1u.

Rref denotes an external reference resistor connected via terminals Tref and BL in series with transistors Z2 and SR1 to constitute a voltage divider. Based on the known resistance of Rref, the output signal DS1 of the voltage divider indicates the impedance of the series connection of transistors Z2 and SR1. Because this series connection is a replica of the series connection of transistor Z1u receiving the same control signal as transistor Z2, and the conducting one of the switching transistors 11 and 12 receiving the same gate potential as SR1, the series connection of transistor Z1u and the conducting one of transistors 11 and 12 has the same impedance as the series connection of transistors Z2 and SR1. Moreover, the impedance value of each of these series connections is adjustable by means of the control signal CS2 corresponding to control signal CS1u.

Reference numeral 51 denotes an operational amplifier acting as a control amplifier and having an inverting input connected to receive the impedance detection signal DS1. Moreover, amplifier 51 has a non-inverting input connected to receive a reference voltage. The output of control amplifier 51 is connected to provide the control signal CS2 to transistor Z2 and the control signal CS1u to transistor Z1u. Ru and Rl denote resistors of a voltage divider connected across supply lines VBH and VBL in order to provide the reference voltage Vref.

The circuit components of FIG. 2 so far described operate as follows. Due to the differential amplification, control amplifier 51 will output the control signals CS2 such that the series connection of transistors Z2 and SR1 takes an impedance that equals Rref multiplied by Ru/Rl. Accordingly, the series impedance of the transistors Z2 and SR1 can be adjusted to a desired value by means of connecting a reference resistor Rref having a desired value. At the same time, the impedance of the upper branch of the output port 3 connected to supply line VBH, will take the same value, due to transistors Z2 and SR1 being replicas of transistor Z1u and switching transistors 11 and 12, respectively. Switching transistors 11 and 12 are similar to each other having the same channel width $W_{SH}$, while switching transistors 13 and 14 are similar to each other having the same channel width $W_{SL}$.

It is to be noted that if the switching transistors 11 to 14 are designed to have a low ON impedance in comparison with the desired output impedance range at port 3, then a replica SR1 of these devices can be omitted. In order to save space on the chip surface, it might, however, be more preferable to design the switching transistor 11 and 12 such that their ON impedance provides a significant contribution to the overall impedance between power supply line VBH and output port 3, and to use transistor Z1u for compensating impedance variations of transistors 11 and 12 and for providing an impedance adjustment range. In this case, the provision of a replica SR1 significantly improves the impedance adjustment accuracy. Preferably, the ON impedance is in the range 30% to 70% of the desired overall impedance between the power supply line VBH and output port 3.

Also, even if the switching transistors provide a significant contribution to the output impedance, it is possible to omit their replicas if the channel geometry of the replica of transistor Z1u is modified towards a higher impedance than Z1u. The resulting impedance accuracy is slightly lower but sufficient for many applications.

The circuit so far described includes all elements more generally discussed with reference to FIG. 1, for controlling the impedance between the upper supply line VBH and output port 3. Although not shown in FIG. 2, a circuit similar to the circuit so far discussed can be taken for controlling the impedance between the lower supply line VBL and output port 3. In this case, a second reference resistor will be necessary, connected between VBH and a series connection of replica transistors of transistor 13 or 14 and Z1l, the other end of this series connection being connected to VBL. This configuration not shown in FIG. 2 would include two independent control loops with two independent reference resistors allowing for independent impedance control of the upper branch between VBH and output port 3 and the lower branch between VBL and output port 3.

FIG. 2 shows a circuit configuration which allows controlling the impedance of the upper branch, i.e. the impedance of the series connection of transistors Z1u and transistor 11 or 12, and simultaneously allows controlling also the impedance of the lower branch, i.e. the impedance of the series connection of transistor Z1l and transistors 13, 14. This is achieved by means of using the control loop so far described with reference to FIG. 2, as a master control loop and by providing a second control loop acting as a slave, i.e. dependent on the first or master control loop, as will be explained in the following.

Reference numeral Z4 denotes a MOSFET which is a replica of transistor Z2. Similarly, reference numeral SR2 denotes a MOSFET which is replica of transistor SR1. Both transistors are connected in series. Moreover, transistor Z4 is connected to supply line VBH, and its gate receives the same control signal CS2 as transistor Z2. The gate of transistor SR2 receives the same potential as the gate of transistor SR1. In this way, the impedance of the series connection of transistor Z4 and SR2 is similar to the impedance of transistors Z2 and SR1 which in turn is controlled by amplifier 51 in accordance with the resistance of reference resistor Rref, as described above.

Reference numeral SR3 denotes a MOSFET which is a replica of switching transistor 13 or 14. Reference numeral Z3 denotes a MOSFET which is a replica of transistor Z1l, connected to the same power supply line VBL as Z1l.

Transistors Z3 and Z1*l* receive at their gates the same control signal CS3 output by a second control amplifier 52. This control amplifier has a noninverting input connected to a voltage divider constituted by the series connection of transistors Z4 and SR2 as an upper impedance and the series connection of transistors SR3 and Z3 as a lower impedance. Due to transistors Z4 and SR2 being replicas of transistors Z2 and SR1 and respectively receiving the same control signal at their gates, the series connection of Z4 and SR2 provides a reference impedance with an impedance value determined depending on Rref. Similar to the operation of control amplifier 51, control amplifier 52 receives at its inverting input the reference voltage Vref generated by the voltage divider Ru and Rl and outputs a control signal CS3, such that the impedance of the series connection of transistors SR3 and Z3 equals the impedance of the series connection of transistors Z4 and SR2 multiplied by Rl/Ru. Due to transistors Z4 and SR2 being replicas of transistors Z2 and SR1, respectively, and due to the action of the master control loop including control amplifier 51 and the slave control loop including control amplifier 52, the series impedance of transistors SR3 and Z3 equals the resistance of the externally connected reference resistor Rref. Due to transistors SR3 and Z3 being replicas of switching transistors 13, 14 and Z1*l*, respectively, and receiving the same gate voltages, also the lower branch impedance between output port 3 and supply line VBL will take the same resistance as Rref. Accordingly, it is possible to adjust both the upper branch impedance and the lower branch impedance of impedance means Z1 with the same reference resistor Rref. If resistors Ru and Rl have the same impedance values, both the upper and the lower branch impedance of impedance means Z1 will have an impedance value corresponding to Rref.

Similar to transistor SR1, also transistors SR2 and SR3 can be left out if switching transistors 13 and 14 are designed to have an ON impedance much smaller than the impedance of transistor Z1*l* or if the channel geometries are modified, as previous described.

Figure 3:
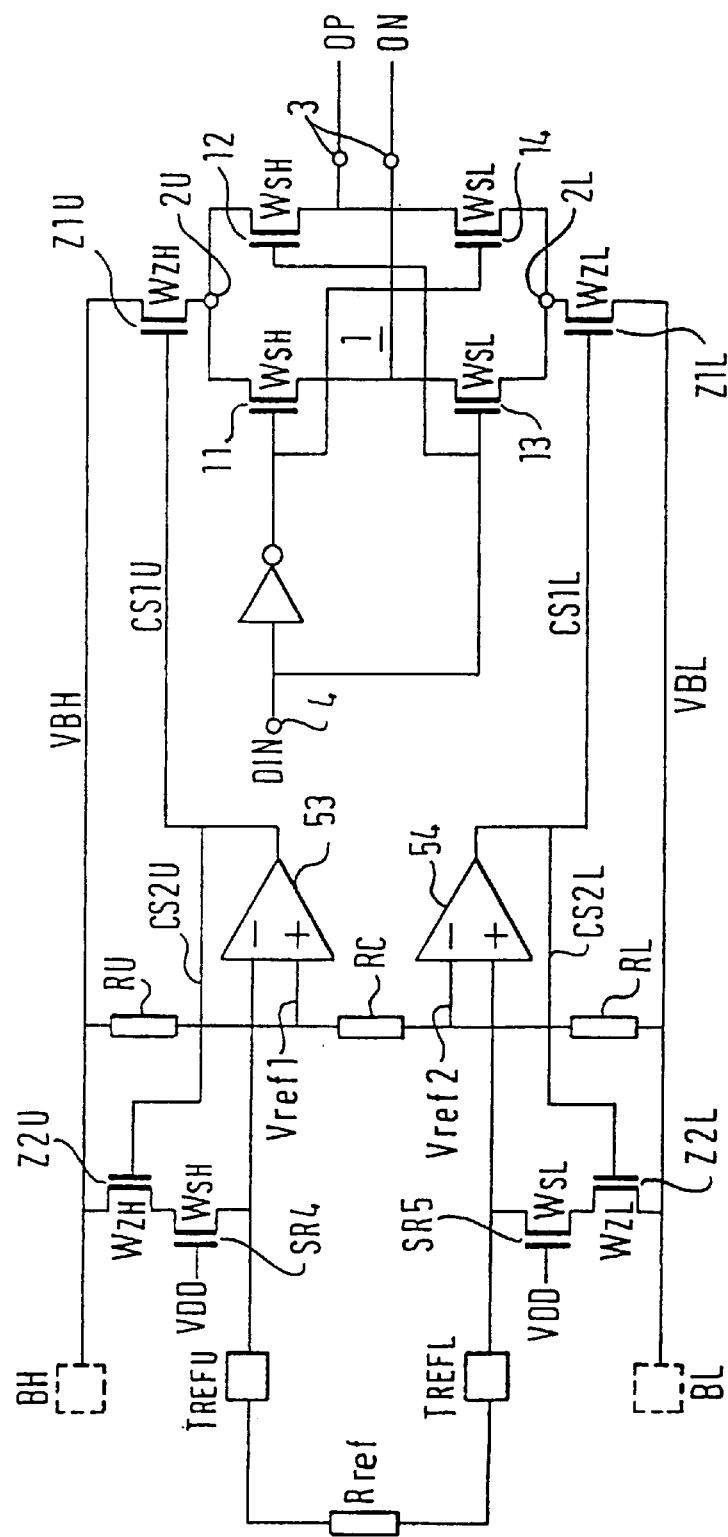
FIG. 3 shows an embodiment of an output buffer circuit having two coupled control loops arranged symmetrically.

FIG. 3 shows an embodiment having a symmetrical arrangement of two impedance control loops. Regarding the switching stage 1 and the first impedance means Z1 incorporating an upper transistor Z1*u* and a lower transistor Z1*l*, the circuit is identical with the circuit of FIG. 2. The circuit of FIG. 3 comprises a series connection of MOSFET Z2*u* being a replica of transistor Z1*u* and having its channel connected to the same power supply line VBH, a MOSFET SR4 being a replica of switching transistors 11, 12, an externally connected reference resistor Rref, a MOSFET SR5 being a replica of switching transistors 13, 14 and a MOSFET Z2*l* being a replica of transistor Z1*l* connected to the same power supply line VBL. These replicas respectively receive the same gate voltages as their corresponding transistors in impedance means Z1 and as their corresponding transistors in the ON state, in the switch stage 1, respectively.

The circuit furthermore comprises a series connection of resistors Ru, Rc and Rl connected as a two-stage voltage divider for supplying a first reference voltage Vref1 received by the non-inverting input of control amplifier 53, and a second reference voltage Vref2 received by the inverting input of control amplifier 54. The inverting input of control amplifier 53 is connected with the terminal of reference resistor Rref connected with transistor SR4 while the non-inverting input of control amplifier 54 is connected with the terminal of reference resistor Rref connected with transistor SR5.

In operation, control amplifiers 53 and 54 will output control signals CS2*u* and CS2*l* to transistor Z2*u* and Z2*l*, respectively, such that the voltage differences across the input terminals of each of control amplifiers 53 and 54 are zero. If Ru is selected to be equal to Rl while Rc has twice the impedance of Ru, these voltage differences will be zero if the impedance of the series connection of transistors Z2*u* and SR4 equals the impedance of the series connection of transistors Z2*l* and SR5 and the sum of these impedances equals Rref.

Due to these impedances being replicas of corresponding transistors of the first impedance means Z1 and the switch stage 1, as mentioned above, also the upper branch impedance between power supply line VBH and output port 3 will take a value of half the reference resistance Rref. Also the lower branch impedance between supply line VBL and output port 3 will have an impedance value of half the reference resistance Rref. Accordingly, the overall output impedance of port 3 will be the sum of the upper and lower branch impedance, that is Rref.

Similar to that what has been discussed with reference to FIG. 2, the replicas SR4, SR5 of the switching transistors 11, 12, 13, 14 may be left out if these switching transistors do not significantly contribute to the output port impedance.

This embodiment is particularly advantageous in that due to the symmetry of the circuit, both the upper and the lower branch impedance can be controlled with high accuracy to the same impedance value, using a single reference resistor only.

Figure 4:
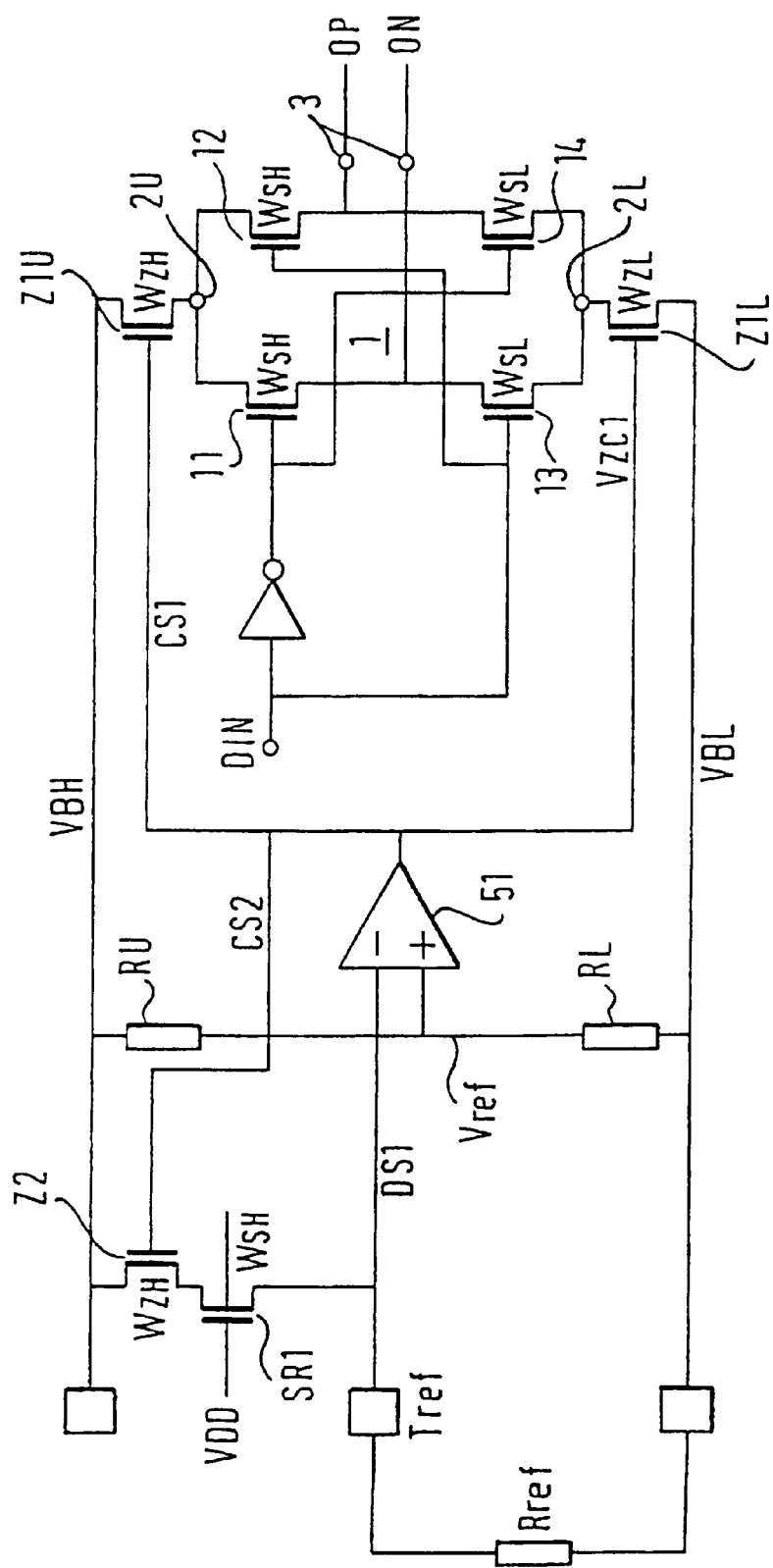
FIG. 4 shows an embodiment of an output buffer circuit having a single control loop for controlling both upper and lower output impedance means.

FIG. 4 shows an embodiment of an output buffer circuit according to the present invention which uses a single control loop for adjusting both the impedance of the upper branch of the first impedance means Z1 between power supply line VBH and output port 3 and the lower branch of the first impedance means Z1 between power supply line VBL and output port 3. In this Figure, the structure of the first impedance means Z1 including transistors Z1*u* and Z1*l* and the structure of the switch stage 1 is similar to the embodiments shown in FIGS. 2 and 3.

The circuit according to FIG. 4 is similar to the circuit described with reference to FIG. 2 with regard to the connection of control amplifier 51 and the circuitry providing the input signals to this amplifier. As already described with reference to FIG. 2, this circuit adjusts the upper branch impedance of the first impedance means Z1, constituted by transistor Z1*u* and the conducting one of switching transistors 11 and 12, to be in accordance with the impedance of the series connection of transistors Z2 and SR1.

The circuit differs from the circuit described in FIG. 2 in that no second control loop is provided for adjusting the impedance of the lower branch impedance constituted by the series connection of transistor Z1 and the conducting one of switching transistors 13 and 14. Rather, also the adjustable impedance element of the lower branch, that is transistor Z1*l*, receives the same gate voltage as the upper transistor Z1*u*. In order to take account of the fact that due to the source of transistor Z1*l* being connected to the lower supply line VBL, the gate source voltage of transistor Z1*l* will be higher than the gate source voltage of the upper transistor Z1*u*, the channel width $W_{ZL}$ of transistor Z1*l* is provided smaller than the channel width of the upper transistor Z1*u*. In this way, inspite of the different gate source voltages of transistors Z1*u* and Z1*l*, the impedances of these transistors are approximately equal and under control of control signal CS2 output by amplifier 51.

This circuit is advantageous in that it needs a single control amplifier 51 only. The circuit is particularly suitable if the supply voltage across the upper supply line VBH and the lower supply line VBL is low, e.g, equal to or less than 1 Volt.

According to a modification (not shown in the figures) of the circuit shown in FIG. 4, the resistor Ru is replaced by a further series connection of a replica of transistor Z1u and a replica of switching transistors 11, 12, while resistor Rl is replaced by a still further series connection of a replica of switching transistor 13 or 14 and a replica of transistor Z1l. The gates of the replicas of switching transistors receive the potential VDD described with reference to FIG. 2 while the replicas of the transistors Z1u and Z1l receive the control signal CS2 output by amplifier 51. The replica of transistor Z1u is connected to the upper supply line VDH while the replica of transistor Z1l is connected to the lower supply line VBL. The modification enables achieving a higher impedance adjustment precision for the lower branch impedance between the lower supply line VBL and output buffer 3.

Figure 5A:
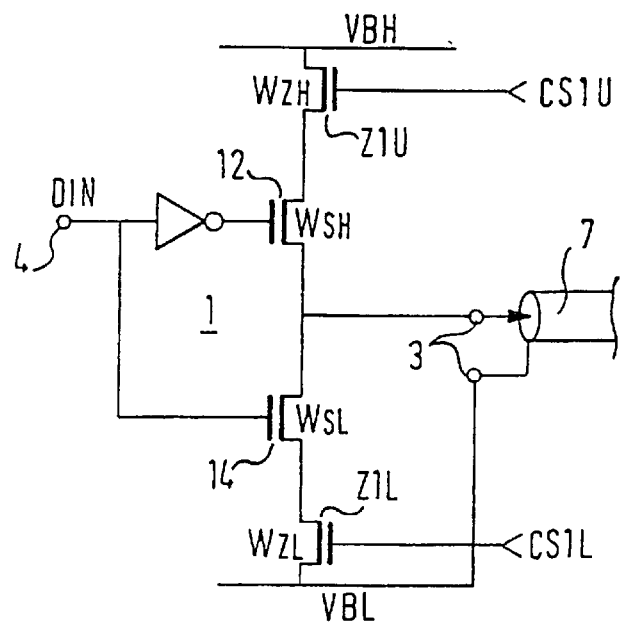
FIG. 5a shows an alternative embodiment of the output stage of the output buffer according to FIG. 2 or FIG. 3.

FIG. 5a shows a modification of the switch stage 1 for driving an asymmetric transmission line 7. As is apparent from this Figure, switch stage 1 comprises a single branch of switching transistors 12 and 14 only. The upper transistor Z1u and the lower transistor Z1l of impedance means Z1 receive control signals CS1u and CS1l, respectively, as described in connection with FIG. 2 or 3.

Figure 5B:
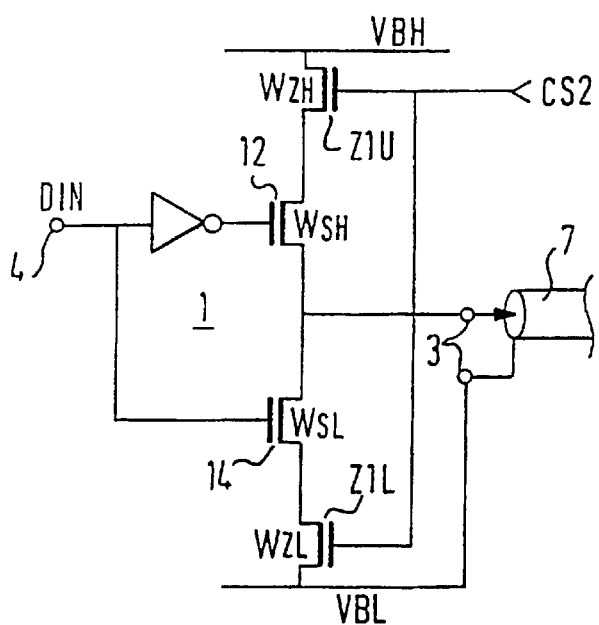
FIG. 5b shows an alternative embodiment of the output stage of the output buffer according to FIG. 4.

FIG. 5b shows a modification of the switching stage 1 used in the circuit of FIG. 4. Again, the switching stage 1 comprises a single branch of switching transistors 12 and 14 only. The upper and lower transistors Z1u and Z1l of impedance means Z1 receive a control signal CS2 as described with reference to FIG. 4.

According to a modification not shown in the figures, a switch stage for driving a symmetrical transmission line comprises two branches, one for each of the conductors of the transmission line, each branch comprising impedance elements and switch elements interconnected as shown in FIG. 5a or 5b, the branches being switched in complementary fashion to achieve symmetrical signal transmission.

Figure 6:
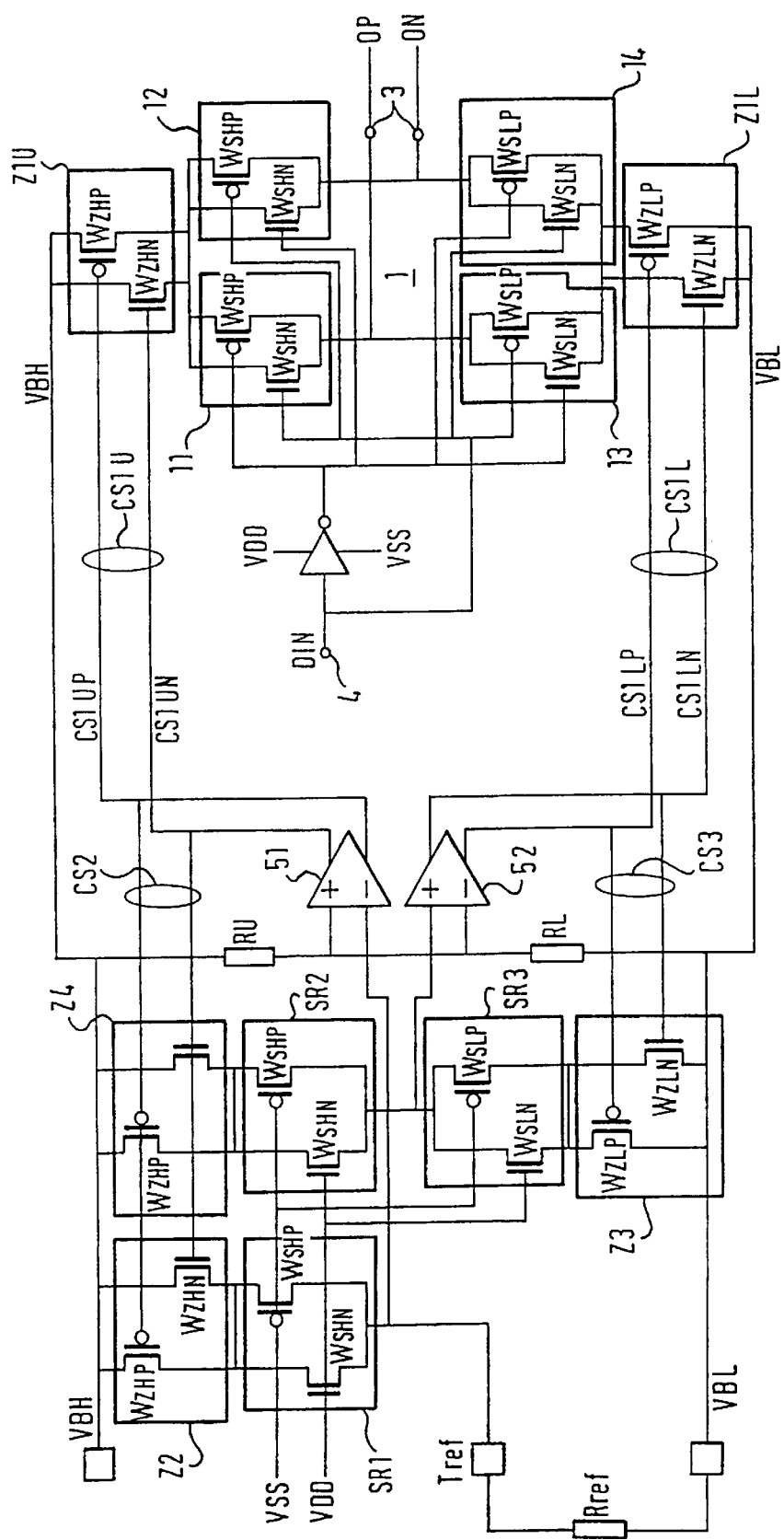
FIG. 6 shows an embodiment of an output buffer circuit having a master and a slave control loop, the output buffer circuit being adapted to drive a transmission line in a floating manner.

FIG. 6 shows an embodiment of an output buffer circuit according to the present invention, particularly designed for driving a symmetrical transmission line in a floating manner, that is such that a potential difference between a common mode potential on the transmission line and the power supply potential VSS or VDD of the internal circuitry of the output buffer circuit can be arbitrary within reasonable limits. The floating operation of the output buffer circuit is achieved by means of providing the output stage 1 with a floating power supply voltage between power supply lines VBH and VBL.

The circuit of FIG. 6 is based on the example described with reference to FIG. 2 and comprises all functional elements of the circuit of FIG. 2. The circuit of FIG. 6 differs from the circuit of FIG. 2 in that each functional element embodied in FIG. 2 by means of a MOSFET transistor, consists of a parallel connection of two MOSFET transistors with opposite conductivity types in the circuit of FIG. 6. Amplifiers 51 and 52 each are provided with a differential output providing a positive and a negative control signal, the positive control signal being applied to the n-type MOSFET of the functional element receiving the control signal, while the negative output is applied to the p-type transistor of the respective functional element. Regarding the switch stage 1, each switch element 11 to 14 comprises a parallel connection of MOSFET transistors with opposite conductivity types driven by complementary control signals. The replicas SR1 to SR3 of these switch elements correspondingly receive complementary signals at their gates to establish electrical conditions similar to the working conditions of the switch elements. Namely, in each replica the p-type MOSFET receives at its gate the VSS potential while the n-type MOSFET receives at its gate the VDD potential.

In order to illustrate the operation of the circuit shown in FIG. 6, it is assumed that the supply voltage across the supply lines VBH and VBL of the output stage 1 floats up with respect to the supply voltage between VDD and VSS of the driving circuitry. This will eventually result in that the potential supplied to the gates of the n-type MOSFETs is no longer sufficient for turning the n-type transistors on. However, the p-type transistors of each functional element will be able to take over the function of the element when due to the voltage across VBH and VBL floating up, the n-MOS devices are no longer able to operate. If on the other hand, the voltage across the supply lines VBH and VBL floats down with respect to the voltage across the supply lines VDD and VSS of the driver circuitry, the p-type MOSFETs will eventually no longer be able to turn on while the n-MOS devices are still able to operate properly. In this way, the provision of a parallel connection of an n-MOS transistor and a p-MOS transistor enlarges the voltage range within which the voltage across the output stage power supply lines VBH and VBL can float up and down with respect to the supply voltage of the driver circuitry.

In order to ensure that the replicas of the upper impedance means Z1u and the lower impedance means Z1l and the replicas of the switches 11 to 14 behave similar to the respective latter elements, also the replicas and the reference resistor Rref are kept floating and are connected across the supply lines VBH and VBL of the output stage of the output buffer circuit.

Modifications to the circuit of FIG. 3 similar to the modifications of FIG. 6 with respect to FIG. 2, can be used in order to render the output buffer of FIG. 3 capable to operate in a floating manner in the sense just explained. In the circuit of FIG. 6, the channel width W of the p-MOS device of a particular functional element is equal to the channel width of the p-MOS device of its replica. The same holds true for the channel width W of the respective n-MOS devices. In this figure, the first index to W denotes the function of the respective element, i.e. S for switch, Z for impedance means. The second index denotes its location, i.e. L for lower branch U for upper branch. The third index denotes its conductivity type, i.e. N or P.

In each of the embodiments previously described, which uses replicas of the switch elements 11 to 14, it is possible to use these replicas for switching off the output buffer if not needed for the time being, in order to save power. This is possible, e.g. by means of providing a circuit that connects the gate of n-MOS replicas of the switch elements 11 to 14 with the positive supply potential VDD and the p-MOS devices, if present, of the replicas of the switch elements 11 to 14 with the potential VSS, to render the output buffer circuit active, and which connects the gate of the n-MOS elements of the replicas with VSS potential while the gates of the p-MOS devices of the replicas are connected with VDD potential, to render the output buffer circuit inactive.

Preferably, in all embodiments described, each functional element and its replica are formed on the same semiconductor chip which ensures in a simple way that the electrical characteristics of each replica closely corresponds to the characteristics of its corresponding functional element.

If in addition to an output buffer circuit integrated on a single semiconductor chip, also an input buffer circuit is integrated on the same semiconductor chip, e.g. in order to enable a bidirectional communication of data, the input buffer circuit advantageously includes a terminal network for terminating the characteristic line impedance and this termination network includes replicas of impedance elements of the output buffer circuit the impedance value of which is adjusted as described above. The replicas in the termination network of the input buffer receive control signals derived from the control signals received by the corresponding impedance means in the output buffer circuit. In a simple and preferable case, these control signals are identical. With this circuit configuration it is possible to ensure proper source impedance matching and matching of the termination impedance with a single reference resistor only.

Of course, while in the above embodiments the reference resistor Rref has been described as an element to be connected externally, it is equally possible to provide this reference resistor on the chip. The reference resistance need not necessarily be provided by means of a resistor but can equally be provided using e.g. a transistor connected to show a desired resistive behaviour.

What is claimed is:

1. An output buffer circuit for driving a transmission line in accordance with data to be transmitted, the output buffer circuit comprising:

a switch stage having an input port, a data port for receiving a data signal in accordance with data to be transmitted, and an output port for connection to said transmission line, the switch stage including at least one switch adapted for connecting the output port to the input port in accordance with the data signal;

a monitor impedance circuit having an adjustable impedance in accordance with a monitor impedance control signal;

an adjusting circuit for generating the monitor impedance control signal to adjust the impedance of the monitor impedance circuit;

a voltage divider including a lower impedance circuit, having an impedance controllable in accordance with a first impedance control signal, and an upper impedance circuit, having an impedance controllable in accordance with a second impedance control signal derived from the monitor impedance control signal, wherein the upper impedance circuit of the voltage divider is connected in series with the lower impedance circuit of the voltage divider;

means for comparing an output of the voltage divider with a reference signal and generating the first impedance control signal in accordance with a deviation of the output of the voltage divider from the reference signal; and a first impedance circuit including an upper impedance device connected to said input port and to a power supply line for supplying an upper potential, and a lower impedance device connected to said input port and to a power supply line for supplying a lower potential, the upper and the lower impedance devices each having an adjustable impedance, wherein the upper impedance device receives a third impedance control signal, derived from the monitor impedance control signal, for adjusting the impedance of the upper impedance device, and the lower impedance device receives a fourth impedance control signal derived from the first impedance control signal for adjusting the impedance of the lower impedance device.

2. The circuit of claim 1, wherein the second impedance control signal is the same as the monitor impedance control signal.

3. The circuit of claim 1, wherein the data signal comprises a digital control signal.

4. The circuit of claim 1, wherein the upper impedance device includes a field effect transistor having one end connected to the input port and having another end connected to the power supply line for supplying the upper potential and wherein the lower impedance device includes a field effect transistor having one end connected to the input port and having another end connected to the power supply line for supplying the lower potential.

5. The circuit of claim 4, wherein the upper impedance device, the lower impedance device, and the input port are connected in series.

6. The circuit of claim 1, wherein the adjusting circuit includes a resistor for detecting an impedance value of the monitor impedance circuit and for generating an impedance value detection signal, and a means for comparing the impedance value detection signal with a reference signal to generate the monitor impedance control signal in accordance with a deviation of the impedance value detection signal from the reference signal.

7. The circuit of claim 6, wherein the monitor impedance circuit includes a field effect transistor having one end connected to the resistor of the adjusting circuit and having another end connected to the power supply line for supplying the upper potential.

8. The circuit of claim 1, wherein the fourth impedance control signal is the same as the second impedance control signal.

9. The circuit of claim 1, wherein the third impedance control signal is the same as the monitor impedance control signal.

10. The circuit of claim 1, wherein the upper impedance device of the first impedance circuit and the lower impedance device of the first impedance circuit each includes a parallel connection of two field effect transistors with opposite conductivity types.

11. The circuit of claim 1, wherein the adjusting circuit adjusts the impedance of the monitor impedance circuit in accordance with a predetermined target impedance value.

12. An output buffer circuit for driving a transmission line in accordance with data to be transmitted, the output buffer circuit comprising:

a switch stage having an input port, a data port for receiving a data signal in accordance with data to be transmitted, and an output port for connection to said transmission line, the switch stage including at least one switch adapted for connecting the output port to the input port in accordance with the data signal;

a monitor impedance circuit having an adjustable impedance in accordance with at least one monitor impedance control signal, the monitor impedance circuit including an upper impedance circuit, having a first end connected to a power supply line for supplying an upper potential, and a lower impedance circuit, having a first end connected to a power supply line for supplying a lower potential;

a resistor connected in series with the upper impedance circuit and the lower impedance circuit, a first end of the resistor connected to a second end of the upper impedance circuit and a second end of the resistor connected to a second end of the lower impedance circuit;

an adjusting circuit for generating the at least one monitor impedance control signal to adjust the impedance of the monitor impedance circuit, the adjusting circuit including a means for comparing a voltage level at the second end of the upper impedance circuit with a first reference voltage to generate an upper monitor impedance control signal for adjusting the impedance of the monitor impedance circuit; and a primary impedance circuit including an upper impedance device connected to said input port and to the power supply line for supplying the upper potential, and a lower impedance device connected to said input port and to the power supply line for supplying the lower potential, the upper and the lower impedance devices each having an adjustable impedance, wherein the upper impedance device receives a first impedance control signal, derived from the upper monitor impedance control signal, for adjusting the impedance of the upper impedance device.

13. The circuit of claim 12, wherein the adjusting circuit further includes a means for comparing a voltage level at the second end of the lower impedance circuit with a second reference voltage to generate a lower monitor impedance control signal for adjusting the impedance of the monitor impedance circuit, the lower impedance device of the primary impedance circuit receiving a second impedance control signal, derived from the lower monitor impedance control signal, for adjusting the impedance of the lower impedance device.

14. The circuit of claim 13, wherein the second impedance control signal is the same as the lower monitor impedance control signal.

15. The circuit of claim 13, wherein the lower monitor impedance control signal is generated in accordance with a deviation of the voltage level at the second end of the lower impedance circuit from the second reference voltage.

16. The circuit of claim 12, wherein the first impedance control signal is the same as the upper monitor impedance control signal.

17. The circuit of claim 12, wherein the upper monitor impedance control signal is generated in accordance with a deviation of the voltage level at the second end of the upper impedance circuit from the first reference voltage.

18. The circuit of claim 12, wherein the adjusting circuit adjusts the impedance of the monitor impedance circuit in accordance with a predetermined target impedance value.

19. An output buffer circuit for driving a transmission line in accordance with data to be transmitted, the output buffer circuit comprising:

a switch stage having an input port, a data port for receiving a data signal in accordance with data to be transmitted, and an output port for connection to said transmission line, the switch stage including at least one switch adapted for connecting the output port to the input port in accordance with the data signal;

a monitor impedance circuit having an adjustable impedance in accordance with a monitor impedance control signal;

an adjusting circuit for generating the monitor impedance control signal to adjust the impedance of the monitor impedance circuit;

a first field effect transistor having a drain, a source, and a gate, the drain of the first field effect transistor connected to a first power supply terminal, the source of the first field effect transistor connected to the switch stage, and the gate of the first field effect transistor connected to receive a primary impedance control signal derived from the monitor impedance control signal for adjusting the impedance of the first field effect transistor; and a second field effect transistor having a drain, a source, and a gate, the source of the second field effect transistor connected to a second power supply terminal, the drain of the second field effect transistor connected to the switch stage, and the gate of the second field effect transistor connected to receive a secondary impedance control signal for adjusting the impedance of the second field effect transistor, wherein a ratio of channel width to channel length of the first field effect transistor is larger than a ratio of channel width to channel length of the second field effect transistor.

20. The circuit of claim 19, wherein the adjusting circuit adjusts the impedance of the monitor impedance circuit in accordance with a predetermined target impedance value.

21. The circuit of claim 19, wherein the primary impedance control signal is the same as the monitor impedance control signal.

22. The circuit of claim 19, wherein the second field effect transistor has the same conductivity type as the first field effect transistor.

23. The circuit of claim 19, wherein the adjusting circuit includes a resistor for detecting an impedance value of the monitor impedance circuit and for generating an impedance value detection signal, and a means for comparing the impedance value detection signal with a reference signal to generate the monitor impedance control signal in accordance with a deviation of the impedance value detection signal from the reference signal.

24. The circuit of claim 19, wherein the secondary impedance control signal is the same as the primary impedance control signal.

25. The circuit of claim 12, wherein the upper monitor impedance control signal is for adjusting the impedance of the upper impedance circuit.

26. The circuit of claim 13, wherein the lower monitor impedance control signal is for adjusting the impedance of the lower impedance circuit.

* * * * *